(12) United States Patent
Takahashi

(10) Patent No.: US 11,143,859 B2
(45) Date of Patent: Oct. 12, 2021

(54) LIGHT SCANNING APPARATUS

(71) Applicant: Akira Takahashi, Tokyo (JP)

(72) Inventor: Akira Takahashi, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 149 days.

(21) Appl. No.: 16/594,497

(22) Filed: Oct. 7, 2019

(65) Prior Publication Data

US 2020/0209616 A1    Jul. 2, 2020

(30) Foreign Application Priority Data

Dec. 27, 2018  (JP) .............................. JP2018-244509

(51) Int. Cl.
*G02B 26/08* (2006.01)
*H01L 41/338* (2013.01)
*G02B 26/10* (2006.01)
*H01L 41/09* (2006.01)

(52) U.S. Cl.
CPC ....... *G02B 26/0858* (2013.01); *G02B 26/101* (2013.01); *H01L 41/0933* (2013.01); *H01L 41/338* (2013.01)

(58) Field of Classification Search
CPC .......................... G02B 26/0858; G02B 26/101; G02B 26/105; H01L 41/338; H01L 41/0933; H01L 41/0953
USPC ...................................................... 359/224.1
See application file for complete search history.

(56) References Cited

U.S. PATENT DOCUMENTS

2012/0162739 A1*  6/2012  Yamada ............... G02B 26/101
                                                         359/212.1

FOREIGN PATENT DOCUMENTS

JP         2017-090638         5/2017

* cited by examiner

*Primary Examiner* — Euncha P Cherry
(74) *Attorney, Agent, or Firm* — IPUSA, PLLC

(57) ABSTRACT

A light scanning apparatus includes a mirror supporting portion having a mirror on a front surface, an actuator configured to driving the mirror supporting portion, a fixed frame disposed around the mirror supporting portion and the actuator, and at least one rib disposed on a back surface side of the mirror supporting portion or the actuator, wherein the rib includes a straight portion and a contact portion having a width wider than a width of the straight portion.

11 Claims, 13 Drawing Sheets

LIGHT SCANNING APPARATUS

CROSS-REFERENCE TO RELATED APPLICATIONS

This application is based on and claims priority to Japanese Patent Application No. 2018-244509, filed on Dec. 27, 2018, the entire contents of which are incorporated herein by reference.

BACKGROUND OF THE INVENTION

1. Field of the Invention

The present invention relates to light scanning apparatuses.

2. Description of the Related Art

A light scanning apparatus is known in which incident light is deflected and scanned by a mirror by swinging the mirror with an actuator including a piezoelectric element or the like. A rib is provided on the back surface side of the mirror supporting portion supporting the mirror to prevent deformation of the mirror.

A plurality of such light scanning apparatuses are simultaneously formed on a single sheet of SOI (Silicon On Insulator) wafer using microfabrication technology of MEMS (Micro Electro Mechanical System). The plurality of light scanning apparatuses formed on a wafer are singulated through a dicing process and picked up from a dicing tape by a pickup process (see, for example, Patent Document 1).

In the dicing process, each light scanning apparatus is divided into chips using a blade with the back surface side of the wafer attached to the dicing tape. In the pickup process, the back surface side of each light scanning apparatus is pushed up by a needle through a dicing tape, and the surface side is adsorbed by a collet, so that each light scanning apparatus is peeled off from the dicing tape.

PATENT DOCUMENT 1

Japanese Laid-Open Patent Application No. 2017-90638

In the light scanning apparatus, a forming region, such as an actuator, is thinned to provide resilience to the actuator, and a fixed frame is provided at the outer periphery to support the formed region. For this reason, in the pickup process, a high rigidity fixed frame which is not thin film is thrust up with a needle through the dicing tape.

However, the dicing tape is attached to a rib provided on the back surface side of the actuator or the like other than a fixed frame. In this case, the stress generated at a time of peeling off the dicing tape when the fixed frame is thrust up with the needle is greater than the stress generated in the fixed frame. Therefore, damage may occur from a connection portion between a fixed frame and the actuator.

The disclosed technique is aimed to prevent breakage in the pickup process.

SUMMARY OF THE INVENTION

A light scanning apparatus includes a mirror supporting portion having a mirror on a front surface, an actuator configured to driving the mirror supporting portion, a fixed frame disposed around the mirror supporting portion and the actuator, and at least one rib disposed on a back surface side of the mirror supporting portion or the actuator, wherein the rib includes a straight portion and a contact portion having a width wider than a width of the straight portion.

DETAILED DESCRIPTION OF EMBODIMENTS

Figure 1A:
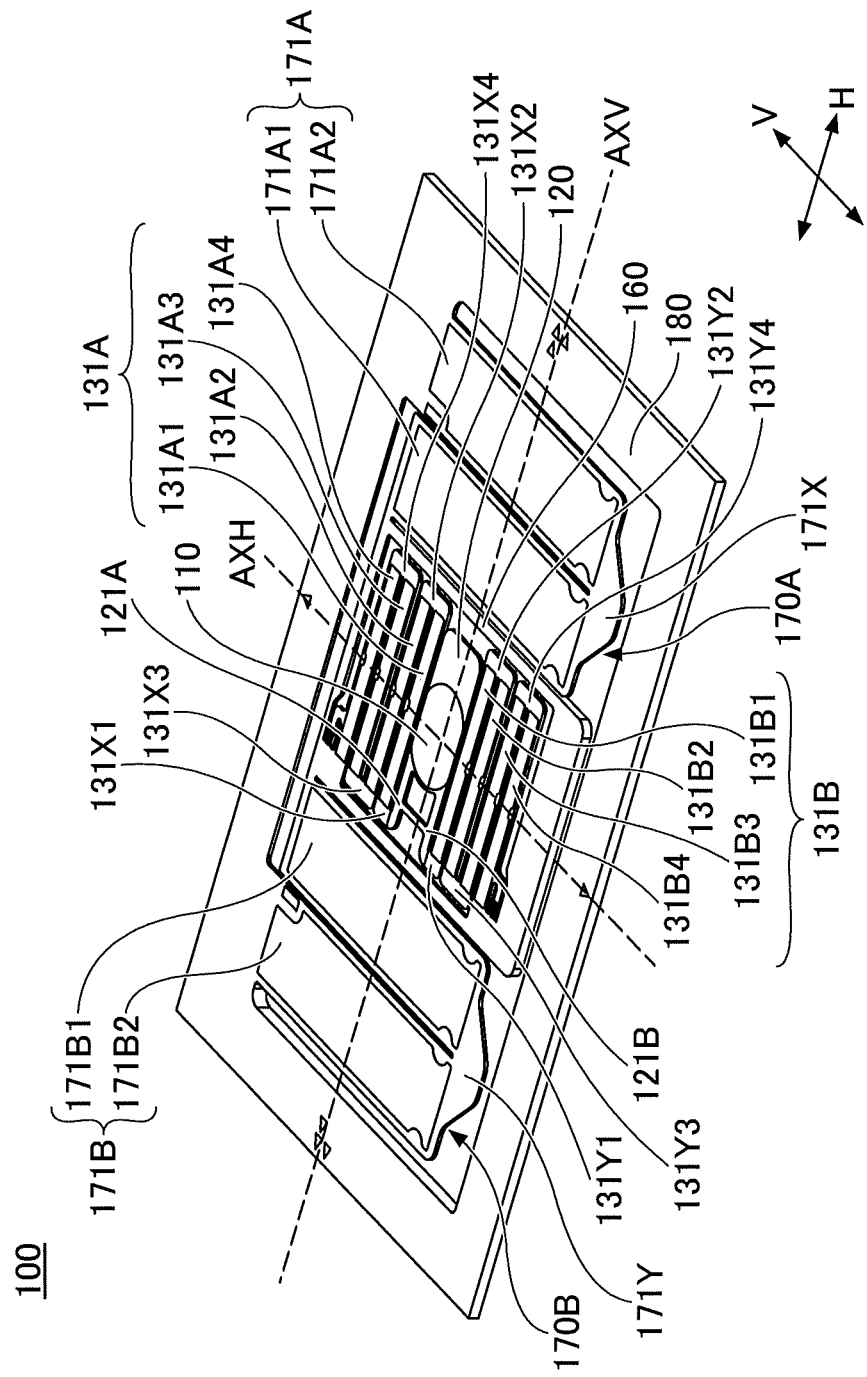
FIGS. 1A and 1B are perspective views illustrating the upper surface side and a perspective view illustrating the lower surface side of the light scanning apparatus according to the first embodiment.

Hereinafter, an embodiment for carrying out the invention with reference to the drawings will be described. In each drawing, the same components are indicated by the same reference numerals and repeated descriptions may be omitted.

Figure 1B:
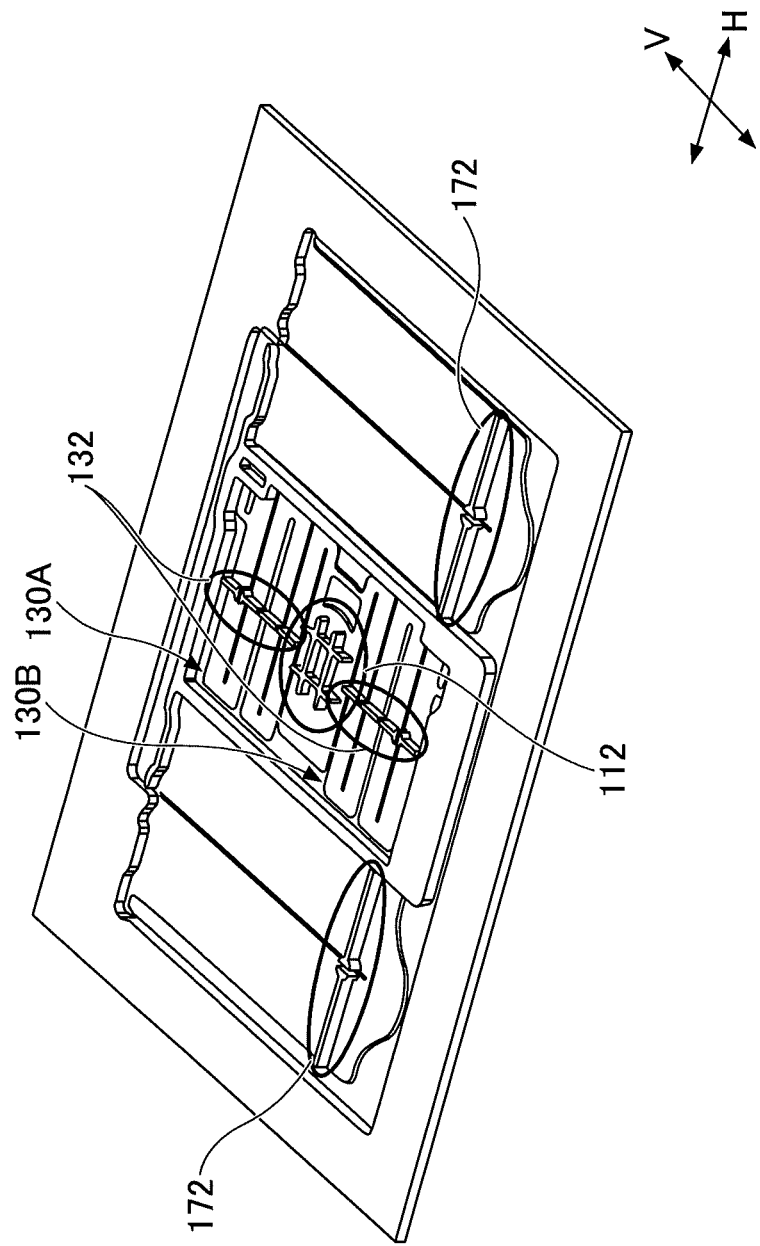

FIG. 1A is a perspective view illustrating a upper surface side of the light scanning apparatus 100 according to a first embodiment. FIG. 1B is a perspective view illustrating a lower surface side of the light scanning apparatus 100 according to a first embodiment. In FIG. 1A, wiring and terminals are not illustrated.

The light scanning apparatus 100 is a portion that swings the mirror 110 to scan laser incident light emitted from a light source. The light scanning apparatus 100 is, for example, a MEMS mirror that drives the mirror 110 by a drive source that is a piezoelectric element. Laser incident light is injected into a mirror 110 provided in the light scanning apparatus 100 to two-dimensionally scan the light emitted from the mirror 110.

The light scanning apparatus 100 includes the mirror 110, a mirror supporting portion 120, connecting beams 121A and 121B, horizontal drive beams 130A and 130B, a movable frame 160, vertical drive beams 170A and 170B, and a fixed frame 180. The mirror 110 is provided on the front surface (the upper surface) of the mirror supporting portion 120.

A pair of horizontal drive beams 130A and 130B are disposed on both sides of the mirror supporting portion 120. The mirror supporting portion 120 and horizontal drive beams 130A and 130B are connected by connection beams 121A and 121B. The horizontal drive beams 130A and 130B, connection beams 121A and 121B, and mirror supporting portions 120 are supported from the outside by a movable frame 160.

The horizontal drive beam 130A has a plurality of rectangular shaped horizontal beams extending in the direction of the vertical rotation axis AXV perpendicular to the horizontal rotation axis AXH. In adjacent horizontal beams, the end portions are connected to each other by turn-back portions 131X2, 131X3, and 131X4, which generally has a bellows structure in a zigzag-like shape. One of the horizontal drive beams 130A is connected to the inner periphery of the movable frame 160 and the other is connected to the mirror supporting portion 120 via the turn-back portion 131X1 and connection beam 121A.

The horizontal drive beam 130B also has a plurality of rectangular shaped horizontal beams extending in the direction of the vertical rotation axis AXV perpendicular to the horizontal rotation axis AXH. In adjacent horizontal beams, the end portions are connected to each other by turn-back portions 131Y2, 131Y3, and 131Y4, which generally has the bellows structure in the zigzag-like shape. One of the horizontal drive beams 130B is connected to the inner circumferential side of the movable frame 160 and the other is connected to the mirror supporting portion 120 through the turn-back portion 131Y1 and the connection beam 121B.

A pair of vertical drive beams 170A and 170B connected to the movable frame 160 are also disposed on both sides of the movable frame 160. The vertical drive beam 170A has a plurality of rectangular vertical beams extending in the direction of the horizontal rotation axis AXH. Adjacent vertical beams have end portions connected together by turn-back portion 171X and generally has the bellows structure in the zigzag-like shape. One of the vertical drive beams 170A is connected to the inner periphery of the fixed frame 180 and the other to the outer periphery of the movable frame 160.

The vertical drive beam 170B also has a plurality of rectangular vertical beams extending in the direction of the horizontal rotation axis AXH. The adjacent vertical beams are connected to each other at their end portions by a turn-back portion 171Y and generally has the bellows structure in the zigzag-like shape. One of the vertical drive beams 170B is connected to the inner periphery of the fixed frame 180 and the other is connected to the outer periphery of the movable frame 160.

The horizontal drive beams 130A and 130B have horizontal drive sources 131A and 131B that are piezoelectric elements, respectively. The vertical drive beams 170A and 170B have vertical drive sources 171A and 171B that are piezoelectric elements, respectively. The horizontal drive beams 130A and 130B and vertical drive beams 170A and 170B function as actuators for swinging the mirror supporting portion 120 in a horizontal direction H and a vertical direction V to scan the laser light.

Horizontal drive sources 131A and 131B are respectively formed on the upper surfaces of horizontal drive beams 130A and 130B for the horizontal beams. The horizontal beams are rectangular sections that do not include curved sections. The horizontal drive source 131A is a piezoelectric element formed on the upper surface of horizontal drive beam 130A and includes a piezoelectric thin film, an upper electrode formed on the upper surface of the piezoelectric thin film, and a lower electrode formed on the lower surface of the piezoelectric thin film. The horizontal drive source 131B is a piezoelectric element formed on the upper surface of the horizontal drive beam 130B and includes a piezoelectric thin film, an upper electrode formed on the upper surface of the piezoelectric thin film, and a lower electrode formed on the lower surface of the piezoelectric thin film.

The horizontal drive beams 130A and 130B are adjacent horizontal drive sources 131A and 131B for each horizontal beam, and by applying the drive voltage of the vertical inverted waveform based on the median value of the driving waveform, the adjacent horizontal beams are reversed between up and down areas, and the accumulation of motions of the horizontal beams in the up and down areas is transmitted to the mirror supporting portion 120.

The movement of the horizontal drive beams 130A and 130B drives the mirror supporting portion 120 to swing along the horizontal rotation axis AXH as an axis. This swing direction is called the horizontal direction H. The above swing axis passing through the center of the mirror 110 is called a horizontal rotation axis AXH. Non-resonant oscillation can be used for horizontal drive by, for example, horizontal drive beams 130A, 130B.

For example, the horizontal drive source 131A includes four horizontal drive sources 131A1, 131A2, 131A3, 131A4, respectively, formed on each of the first to fourth horizontal beams forming the horizontal drive beam 130A. The horizontal drive source 131B also includes four horizontal drive sources 131B1, 131B2, 131B3, and 131B4, respectively, formed on each of the first to fourth horizontal beams forming horizontal drive beam 130B.

In this case, by driving the horizontal drive sources 131A1, 131B1, 131A3, and 131B3 using the same waveform and driving the horizontal drive sources 131A2, 131B2, 131A4, and 131B4 using the waveform in which the electric potential is inverted at the reference value, the mirror supporting portion 120 can be swung in the horizontal direction.

The vertical drive sources 171A and 171B are respectively formed on the upper surface of the vertical drive beams 170A and 170B. A vertical beam is a rectangular portion that does not include a curved section. The vertical drive source 171A is a piezoelectric element formed on the upper surface of vertical drive beam 170A and includes a piezoelectric thin film, an upper electrode formed on the upper surface of the piezoelectric thin film, and a lower electrode formed on the lower surface of the piezoelectric thin film. The vertical drive source 171B is a piezoelectric element formed on the upper surface of the vertical drive beam 170B and includes a piezoelectric thin film, an upper electrode formed on the upper surface of the piezoelectric thin film, and a lower electrode formed on the lower surface side of the piezoelectric thin film.

The vertical drive beams 170A and 170B are respectively the adjacent vertical drive sources 171A and 171B for each vertical beam. By applying drive voltages of the vertical inverted waveform on the basis of the median value of the drive waveform, the adjacent vertical beams are inverted in the opposite direction of the vertical beam, and the accumulation of motions of the horizontal beams in the up and down areas is transmitted to the movable frame 160.

The movement of the vertical drive beams 170A and 170B drives to swing the mirror supporting portion 120 in a direction perpendicular to the direction of the horizontal axis AXH. This swing direction is called the vertical direction V. The above swing axis passing through the center of the mirror 110 is referred to as the vertical rotation axis AXV.

For example, non-resonant oscillation can be used for a vertical drive performed by the vertical drive beams 170A and 170B.

For example, the vertical drive source 171A includes two vertical drive sources 171A1, 171A2 formed respectively on the first to second vertical beams constituting the vertical drive beam 170A. The vertical drive source 171B also includes two vertical drive sources 171B1, 171B2 formed respectively on the first to second vertical beams constituting the vertical drive beam 170B.

In this case, the vertical drive sources 171A1 and 171B1 can be driven using the same waveform, and the vertical drive sources 171A2 and 171B2 can be driven using a waveform obtained by inverting the potential at a reference value, so that the movable frame 160 connected to the mirror supporting portion 120 can swing in the vertical direction.

In the light scanning apparatus of this embodiment, a MEMS structure functioning as an actuator is formed, for example, by a SOI substrate formed by laminating a support layer, a buried oxide layer (BOX layer), and a silicon active layer. The fixed frame 180, the movable frame 160, and the like are structured to have three layers: a support layer, a BOX layer, and a silicon active layer.

On the other hand, portions of the horizontal drive beams 130A and 130B and the vertical drive beams 170A and 170B other than the fixed frame 180 and the movable frame 160 are structured to have a single layer of the silicon active layer or two layers of the BOX layer and the silicon active layer.

In the light scanning apparatus of the present embodiment, a rib 112 is formed at a position facing the mirror 110 on the back surface of the mirror supporting portion 120. Ribs 112 formed on the backside of mirror supporting portions 120 enhance the rigidity of mirror supporting portions 120. The shape of the ribs 112 will be described later.

In the light scanning apparatus of this embodiment, the horizontal drive sources 131A and 131B are formed on the surface (the upper surface) of the horizontal beam constituting the horizontal drive beams 130A and 130B, and the ribs 132 are formed on the horizontal rotation axis AXH, which is the center of the horizontal beam forming the horizontal drive beams 130A and 130B, on the other back surface (the lower surface). The ribs 132 are short in the longitudinal direction of the horizontal beams and long in the short-hand direction. The ribs 132 have a function to suppress vibration and breakage of the bellows due to vibration or water flow during dicing, for example, in the manufacturing process of the MEMS structure.

In the light scanning apparatus according to this embodiment, vertical drive sources 171A and 171B are formed on the surface (upper surface) of the vertical drive beams 170A and 170B. Ribs 172 are formed on the back (bottom) surface of the vertical beams. The ribs 172 are formed, for example, at a position where the distance from the coupling portion of the vertical beams and the turn-back portions 171X and 171Y is 10 to 20% of the length of the vertical beams. The ribs 172 are short in the longitudinal direction and long in the short-hand direction of the vertical beams. The ribs 172 prevent the vertical drive beams 170A and 170B from becoming unnecessarily warped to the width of the vertical beams.

Ribs 112 have the same height (thickness) as fixed frame 180 and movable frame 160. That is, when the MEMS structure serving as an actuator of the light scanning apparatus is formed of a SOI substrate, a rib 112 is formed from the BOX layer and the support layer at the back surface of the mirror supporting portion 120 formed from the silicon active layer. The surface around the ribs 112 is exposed with the support and BOX layers removed.

The horizontal beams comprising the horizontal drive beams 130A and 130B are formed of a silicon active layer. The ribs 132 are formed of a BOX layer and a support layer. The vertical beams constituting the vertical drive beams 170A and 170B are formed from the active layer. The ribs 172 are formed of a BOX layer and a support layer.

Ribs 112, 132, and 172 are formed by etching the support layer of the SOI substrate and the BOX layer. The BOX layer around the ribs 112, 132, and 172 need not be removed. The ribs 112, 132, and 172 may be formed by etching the SOI substrate or by a bulk silicon etched step.

The shape of each rib will be described below.

Figure 2:
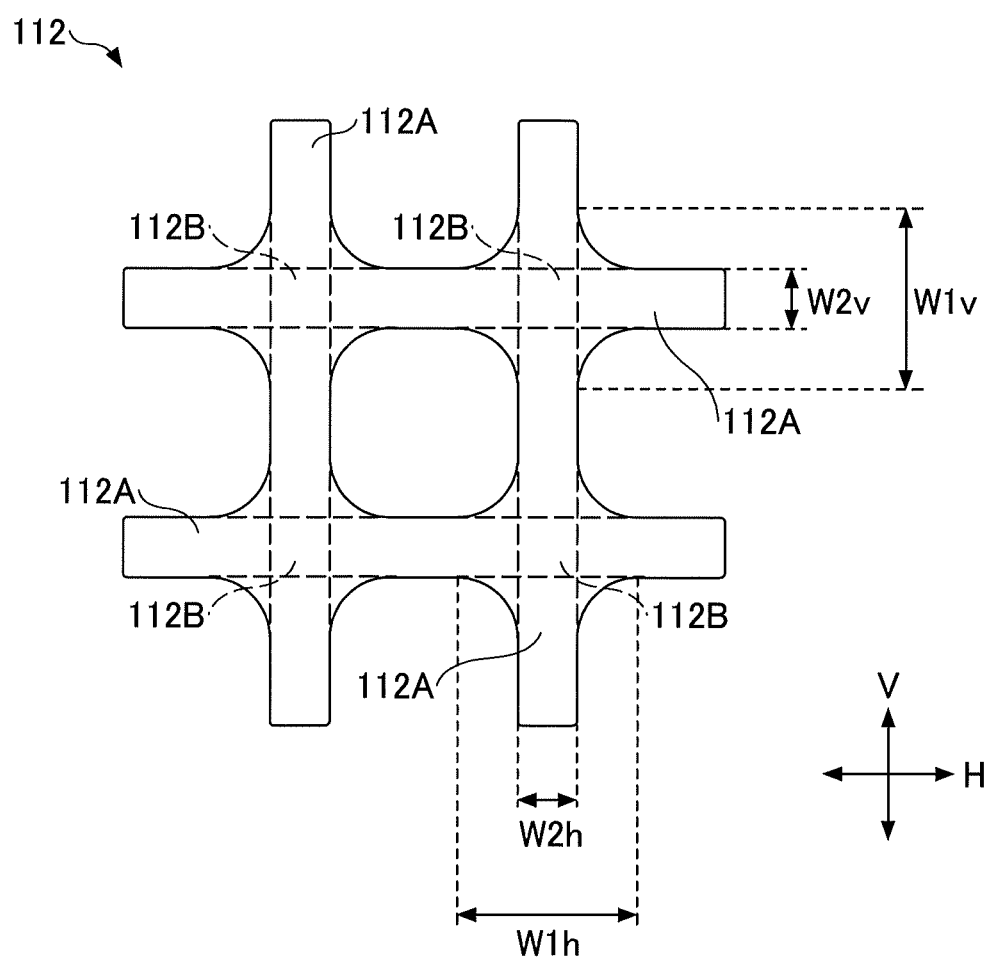
FIG. 2 is a plan view illustrating the shape of a rib formed on the back surface of a mirror supporting portion.

FIG. 2 is a plan view illustrating the shape of ribs 112 formed on the back surface of mirror supporting portion 120. As illustrated in FIG. 2, two straight portions 112A extending in a horizontal direction H and two straight portions 112A extending in a vertical direction V are in the shape of a well girder. Four intersection portions 112B are wider in horizontal direction H and vertical direction V than straight portions 112A. In this embodiment, each straight portion 112A is progressively widened within a predetermined distance from the intersection portion 112B as it moves toward the intersection portion 112B.

Each intersection portion 112B serves as an contact portion against which the thrust needle contacts through the dicing tape in the pickup process after dicing.

It is preferable that the width $W1h$ to the horizontal direction H of the intersection portion 112B be larger than the width $W2h$ to the horizontal direction H of the straight portion 112A extending in the vertical direction V, and that the width is not less than three times ($W1h \geq 3 \times W2h$). Similarly, the width $W1v$ of the intersection portion 112B to the vertical direction V is preferably larger than the width $W2v$ of the straight portion 112A extending in the horizontal direction H to the vertical direction V, and is not less than three times ($W1v \geq 3 \times W2v$). The corners of the ribs 112 are preferably rounded to reduce stress concentration.

Figure 3:
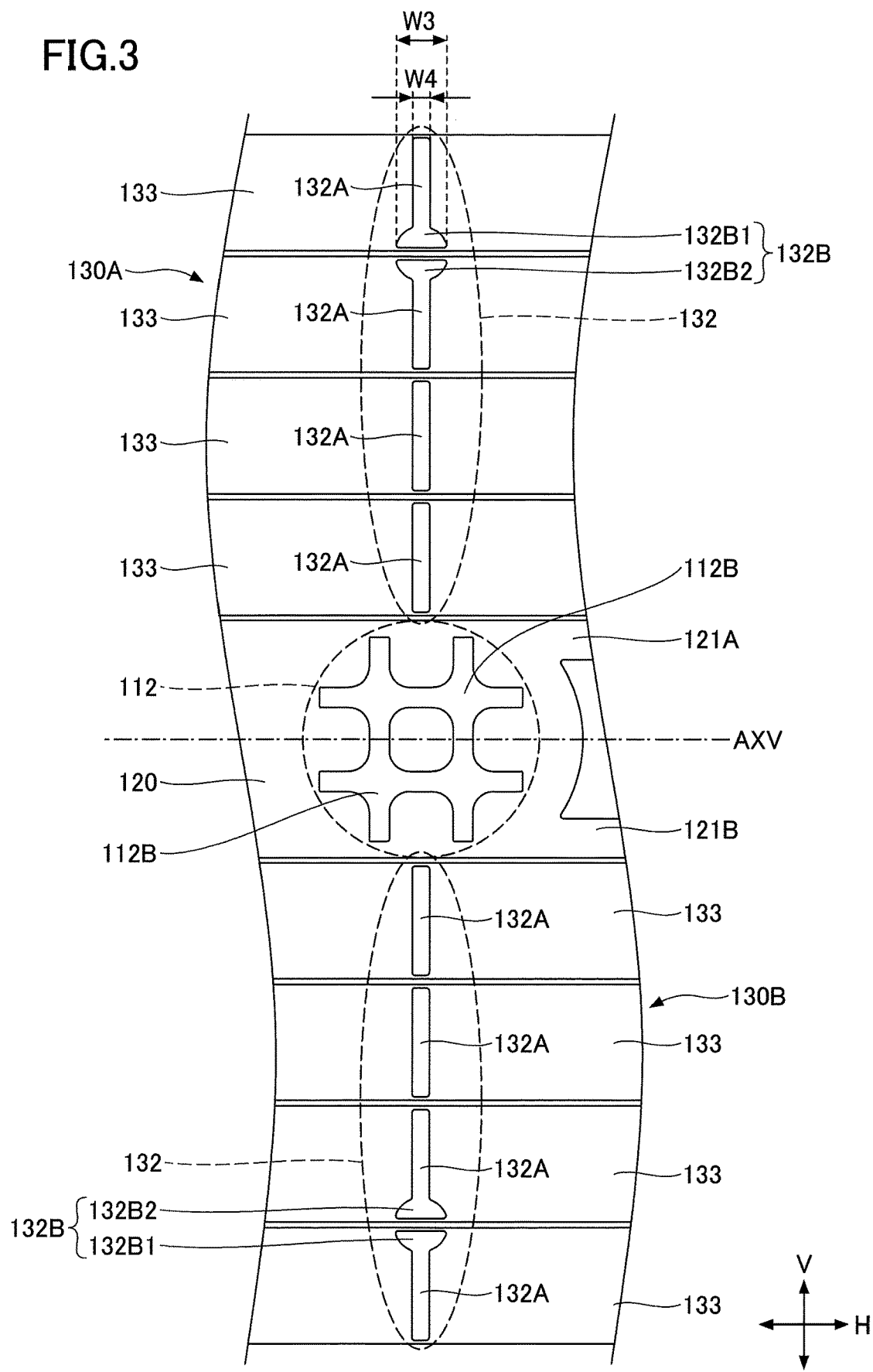
FIG. 3 is a plan view illustrating a shape of a rib formed on the back surface of a horizontal drive beam.

FIG. 3 is a plan view illustrating the shape of the rib 132 formed on the back surface of the horizontal drive beams 130A and 130B. Ribs 132 include straight portions 132A extending in a vertical direction V provided for each horizontal beam 133 forming the horizontal drive beams 130A and 130B. Each straight portion 132A is disposed on a horizontal rotation axis AXH. Each straight portion 132A has a length approximately the same as the width of each horizontal beam 133 in the vertical direction V. That is, straight portions 132A are adjacent to each other on the corresponding adjacent horizontal beams 133.

The end portions 132B1 and 132B2 are wider than the straight portion 132A in the horizontal direction H at adjacent portions of a pair of horizontal beams 133 located outside of the horizontal drive beam 130A. In this embodiment, a pair of adjacent end portions 132B1, 132B2 are generally circular. Preferably, the width W3 of the end portions 132B1 and 132B2 in the horizontal direction H is larger than the width W4 of the straight portion 132A in the horizontal direction H and is not less than three times ($W3 \geq 3 \times W4$).

The corners of the ribs 132 are also preferably rounded to reduce stress concentration.

Similarly for horizontal drive beam 130B, the end portions 132B1, 132B2 are wider than the straight portion 132A in the horizontal direction H at adjacent portions of a pair of outwardly positioned horizontal beams 133. In this embodiment, a pair of adjacent end portions 132B1, 132B2 are substantially in a circular shape as a whole. Preferably, the width W3 of the end portions 132B1 and 132B2 in the horizontal direction H is larger than the width W4 of the straight portion 132A in the horizontal direction H and is not less than three times (W3≥3×W4).

Each end portion 132B1, 132B2 functions as a contact portion 132B that contacts the thrust needle through the dicing tape in the pickup process after dicing. The contact portion 132B formed in the ribs 132 of the horizontal drive beam 130A and the contact portion 132B formed in the ribs 132 of the horizontal drive beam 130B are disposed on the horizontal rotation axis AXH and at a position that is linearly symmetrical with respect to the vertical rotation axis AXV.

Figure 4:
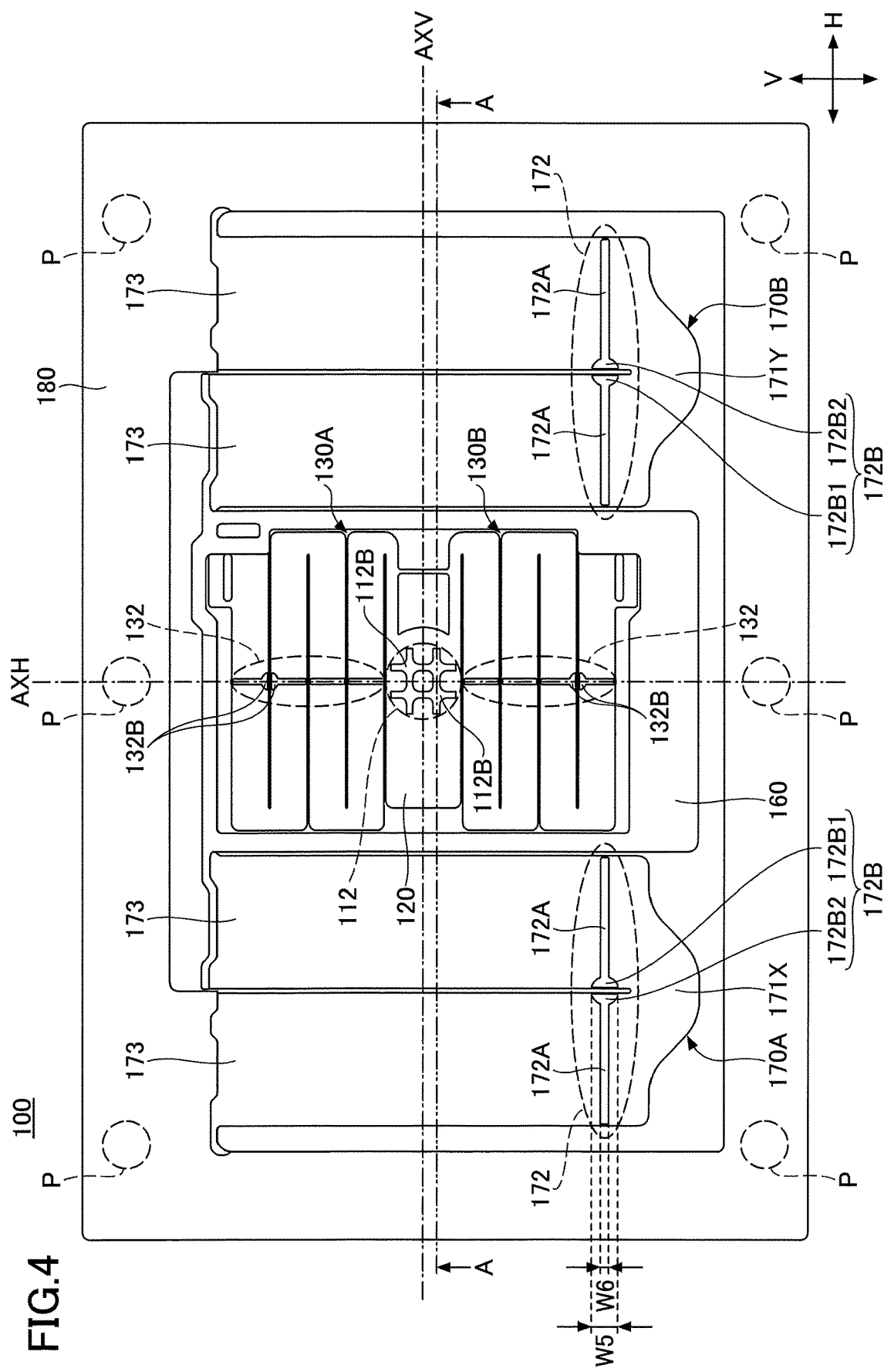
FIG. 4 is a plan view illustrating a shape of a rib formed on the back surface of a vertical drive beam.

FIG. 4 is a plan view illustrating the shape of a rib 172 formed on the back surface of vertical drive beams 170A and 170B. The ribs 172 include straight portions 172A extending in a horizontal direction H provided for each vertical beam 173 constituting vertical drive beams 170A and 170B. In this embodiment, each straight portion 172A is provided near the end portion of the vertical beam 173 at the turn-back portions 171X and 171Y. Each straight portion 172A has a length approximately the same as the width of each vertical beam 173 in the horizontal direction H. That is, straight portions 172A are adjacent in the corresponding adjacent vertical beams 173.

The ribs 172 have end portions 172B1 and 172B2 wider along the vertical direction V than the straight portions 172A at the adjacent portions. In this embodiment, a pair of adjacent end portions 172B1, 172B2 are circular as a whole. Preferably, the width W5 of the end portions 172B1 and 172B2 to the vertical direction V is larger than the width W6 of the straight portion 172A to the vertical direction V and is not less than three times (W5≥3×W6). The corners of the ribs 172 are also preferably rounded to reduce stress concentration.

Each end portion 172B1, 172B2 functions as a contact portion 172B which contacts the thrust needle through the dicing tape in the pickup process after dicing.

The contact portion 172B formed in the ribs 172 of the vertical drive beam 170A and the contact portion 172B formed in the ribs 172 of the vertical drive beam 170B are disposed at a position that is linearly symmetrical with respect to the horizontal rotation axis AXH.

The reference numeral P in FIG. 4 indicates a contact portion of the fixed frame 180 in which the needle 220 used in the pickup process (described later) contacts. It is preferable that the contact portion P be a position where it is linearly symmetrical with respect to the horizontal rotation axis AXH or the vertical rotation axis AXV.

Figure 5:
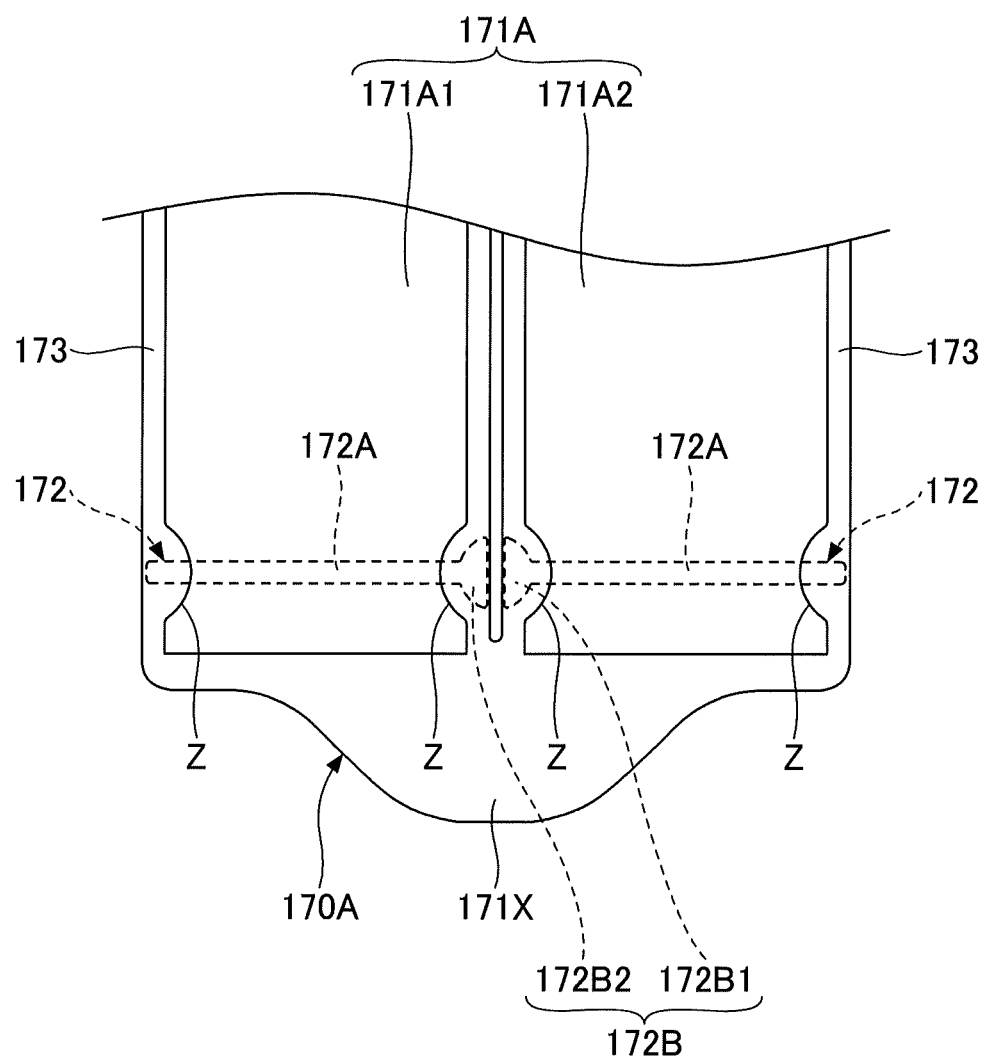
FIG. 5 is a plan view illustrating an enlarged upper surface near a folded portion of a vertical drive beam.

FIG. 5 is a plan view illustrating an enlarged upper surface near a turn-back portion 171X of a vertical drive beam 170A. On one side (top) of the vertical beam 173, vertical drive sources 171A1 and 171A2, which are piezoelectric elements, are formed, while on the other side (back) a rib 172 is formed at a position indicated by a dashed line.

A notch Z is formed in the portion of the vertical drive sources 171A1 and 171A2 facing the end portion of the rib 172. For example, the notch Z is a region in which a portion of the vertical drive sources 171A1 and 171A2 is removed in a semi-circular shape. That is, vertical drive sources 171A1, 171A2 are not provided at positions corresponding to a pair of end portions 172B1, 172B2 that constitute contact portion 172B of ribs 172. The shape of the notch Z is not limited to the semi-circular shape.

By providing a notch Z in the rib 172, the ribs 172 narrow the width of the vertical drive sources 171A and 171B, suppressing short-hand warping and reducing stress, as well as dispersing the stress transmitted from the other portions in a silicon active layer with the ribs 172. This reduces the stress on the base of the end portion of the ribs 172.

Figure 6:
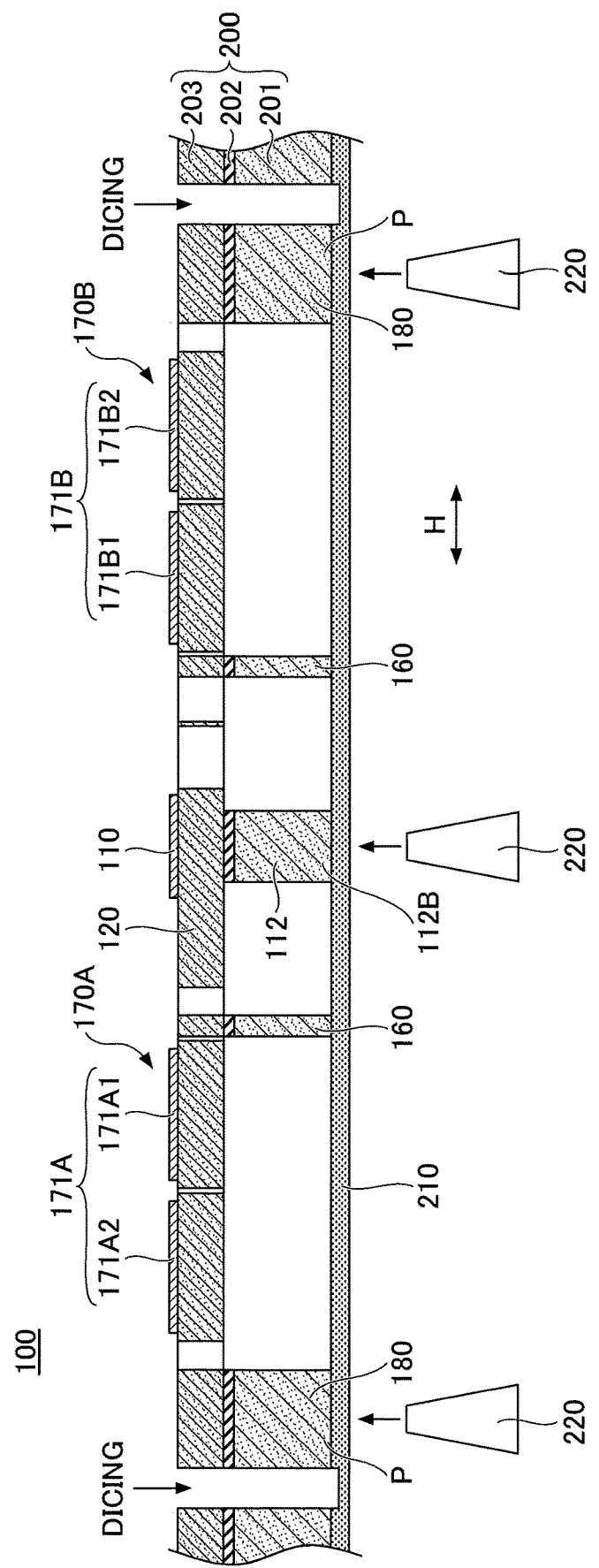
FIG. 6 is a cross-sectional view schematically illustrating a cross-section of the light scanning apparatus taken along an A-A line in FIG. 4.

FIG. 6 is a schematic diagram illustrating a cross-section of the light scanning apparatus 100 cut along an A-A line in FIG. 4. The light scanning apparatus 100 is simultaneously formed on a single SOI wafer using MEMS microfabrication techniques. FIG. 6 illustrates a state after an SOI substrate 200 as an SOI wafer having a plurality of light scanning apparatuses 100 formed thereon is attached to a dicing tape 210 and the SOI substrate 200 is cut (diced) by a blade between adjacent light scanning apparatuses 100.

The SOI substrate 200 may be laminated with a support layer 201 that is made of silicon (Si), a BOX layer 202 that is made of silicon dioxide ($SiO_2$), and a silicon active layer 203 that is made of monocrystal silicon. Beyond the fixed frame 180 and movable frame 160, the support layer 201 and the BOX layer 202 are etched off, and the ribs 112, 132, and 172 are formed by leaving the support layer 201 and the BOX layer 202 without removing.

In the dicing process, the support layer 201 is attached to the dicing tape 210. After the dicing process, in the pickup step, the back surface side (the support layer 201 side) of each light scanning apparatus 100 is pushed up by a plurality of needles 220 through the dicing tape 210, and the surface side (the silicon active layer 203 side) is adsorbed by a collet, so that each light scanning apparatus 100 is peeled off from the dicing tape 210.

The needle 220 contacts, through the dicing tape 210, the contact portions P of the fixed frame 180 and the contact portions 112B, 132B, and 172B provided integrally with the ribs 112, 132, and 172 other than the fixed frame 180 to raise the light scanning apparatus 100.

As described above, in the pickup process, when the ribs 112, 132, and 172 formed integrally with the fixed frame 180 other than the fixed frame 180 are thrust up by the needle 220, the stress generated when the ribs 112, 132, and 172 peel off from the dicing tape 210 is reduced, and damage caused by the connection portion between the fixed frame 180 and the actuator is suppressed.

Further, because the width of each contact portion integrally formed with the ribs 112, 132, and 172 is larger than the width of the straight portion, the ribs 112, 132, and 172 are prevented from being damaged by thrust at the needle 220.

In the pickup process, it is not necessary to thrust the needle 220 into contact with all of the contact portions of the ribs 112, 132, and 172, but only a portion of the contact portions may be thrust up. However, it is preferable to thrust an contact portion of the rib 112 provided at least at the center of the light scanning apparatus 100.

As in this embodiment, the plurality of contact portions integral with the ribs are preferably positioned in a linear or point symmetry location.

MODIFIED EXAMPLE

Next, various modifications of the first embodiment will be described.

Independent Contact Portion

In a first embodiment, the needle 220 is integrally formed with the ribs 112, 132, and 172 abutting through the dicing tape 210, although a separate contact portion may be provided.

Figure 7:
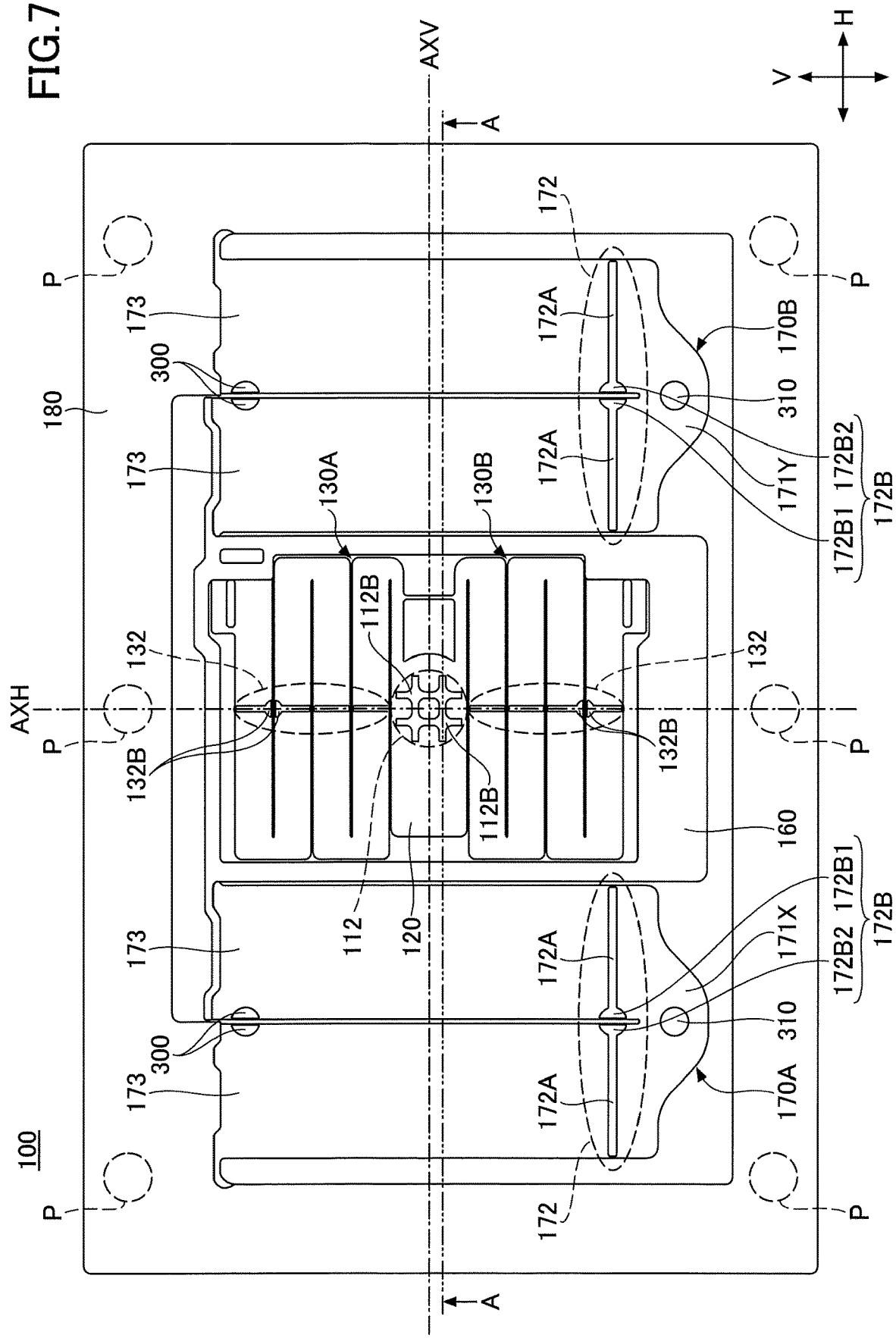
FIG. 7 is a plan view illustrating an example of a scanning apparatus in which an independent contact portion is provided.

FIG. 7 is a plan view illustrating an example of a scanning apparatus in which an independent contact portion is provided. In the example illustrated in FIG. 7, separate contact portions 300 and 310 are provided on the back surfaces of the vertical drive beams 170A and 170B. The contact portions 300 and 310 are formed by etching and patterning the support layer 201 as well as the ribs 112, 132 and 172.

The contact portion 300 is formed in adjacent portions of adjacent vertical beam 173 at vertical drive beams 170A and 170B. The contact portion 300 is disposed at an end portion opposite to the turn-back portions 171X and 171Y. The contact portion 300 is formed of two portions separated by adjacent portions of the vertical beam 173 and is circular as a whole.

The contact portion 300 formed in the vertical drive beam 170A and the contact portion 300 formed in the vertical drive beam 170B are positioned so as to be linearly symmetrical with respect to the horizontal rotation axis AXH. Each contact portion 300 is disposed at a position where the contact portion 172B (a pair of end portions 172B1 and 172B2) formed in the ribs 172 is substantially symmetrical to the vertical rotation axis AXV.

The contact portion 310 is formed in the turn-back portions 171X and 171Y. The contact portion 310 is undivided and generally circular. The contact portion 310 is positioned between adjacent vertical beams 173 in the horizontal direction H. The contact portion 310 formed in the turn-back portion 171X and the contact portion 310 formed in the turn-back portion 171Y are disposed at a position where the contact portion is linearly symmetrical with respect to the horizontal rotation axis AXH.

The contact portions 300 and 310 abut the thrust needle 220 through the dicing tape 210 in the pick-up process after dicing.

Shape of Contacting Portion

Figure 8A:
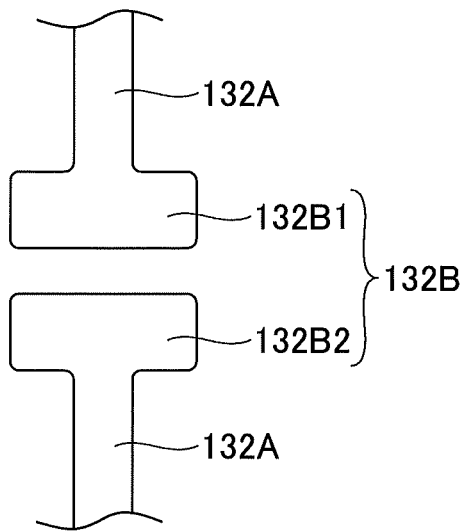
FIGS. 8A-8D are plan views illustrating a modification of the shape of an contact portion formed on a rib.
Figure 8B:
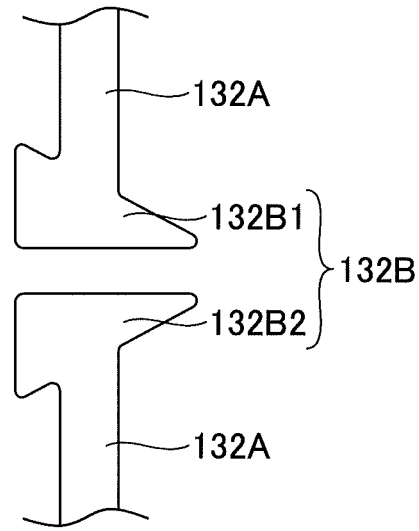
Figure 8C:
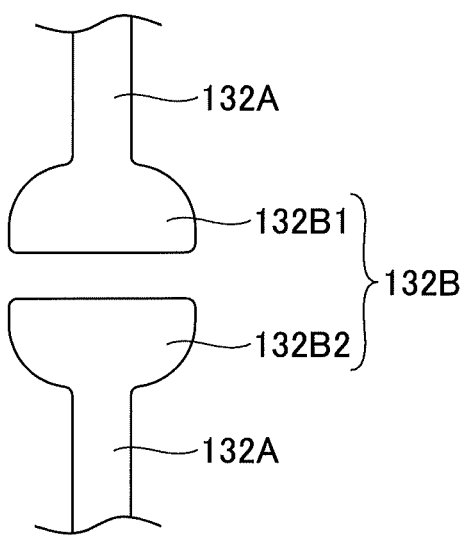
Figure 8D:
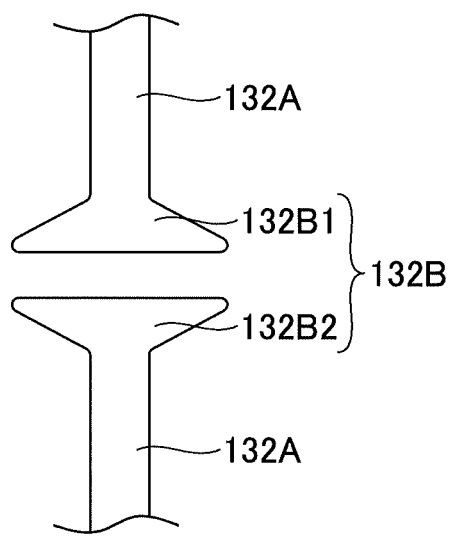

FIGS. 8A-8D are plan views illustrating a modified example of the shape of the contact portion 132B (a pair of end portions 132B1, 132B2) formed on the ribs 132. FIG. 8A illustrates an example in which a pair of end portions 132B1 and 132B2 are a rectangle as a whole. FIG. 8B illustrates an example in which a pair of end portions 132B1 and 132B2 are a triangle as a whole. FIG. 8C illustrates an example in which a pair of end portions 132B1 and 132B2 are in an oval as a whole. FIG. 8D illustrates an example in which a pair of end portions 132B1, 132B2 are in a diamond as a whole.

The shape of the contact portion 132B is not limited thereto, but may be other shapes. The shape of the contact portion 172B (a pair of end portions 172B1 and 172B2) formed on the ribs 172 can also be modified in a similar manner thereto.

Figure 9A:
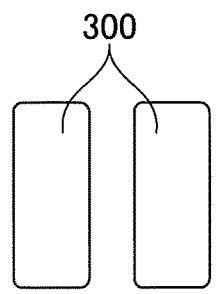
FIGS. 9A-9D are plan views illustrating an exemplary modification of the shape of an independent contact portion.
Figure 9B:
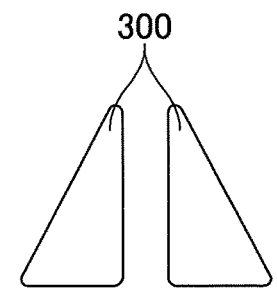
Figure 9C:
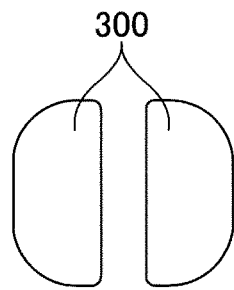
Figure 9D:
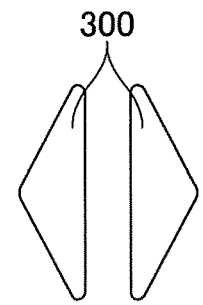
Figure 10A:
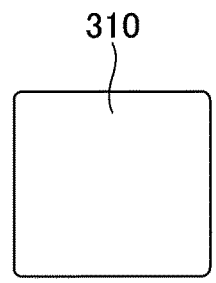
FIGS. 10A-10D are plan views illustrating a modification of the shape of an independent contact portion.
Figure 10B:
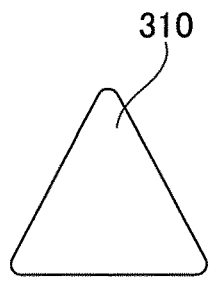
Figure 10C:
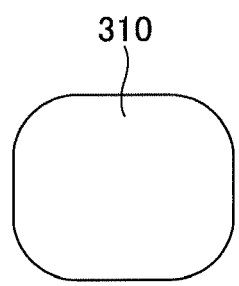
Figure 10D:
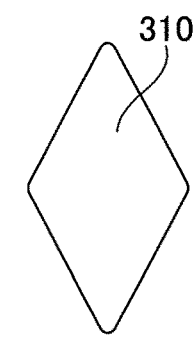

FIGS. 9A-9D are plan views illustrating a modified example of the shape of an independent contact portion 300. FIG. 9A is an example in which the contact portion 300 is a rectangle as a whole. FIG. 9B illustrates an example in which the contact portion 300 is a triangle as a whole. FIG. 9C illustrates an example in which the contact portion 300 is an oval as a whole. FIG. 9D illustrates an example in which the contact portion 300 is a diamond as a whole. The shape of the contact portion 300 is not limited thereto, but may be other shapes.

FIG. 10 is a plan view illustrating a modified example of the shape of an independent contact portion 310. FIG. 10A is an example in which the contact portion 310 is a rectangle as a whole. FIG. 10B illustrates an example in which the contact portion 310 is a triangle as a whole. FIG. 10C illustrates an example in which the contact portion 310 is an oval as a whole. FIG. 10D illustrates an example in which the contact portion 310 is a diamond as a whole. The shape of the contact portion 310 is not limited thereto, but may be other shapes.

The contact portion (the intersection portion 112B) of the ribs 112 formed on the back surface of the mirror supporting portion 120 may also be shaped to be a circle, rectangle, triangle, or the like. The overall shape of the ribs 112 is not limited to the well girder shape, and may be modified appropriately.

Application to Other Light Scanning Apparatuses

In the light scanning apparatus 100 of the first embodiment, both the horizontal drive beam and the vertical drive beam have a bellows structure, and both the horizontal drive and the vertical drive are non-resonant drives. The present invention is also applicable to a scanning apparatus that supports the mirror using torsion bars to enable the horizontal drive to be resonantly driven.

Figure 11:
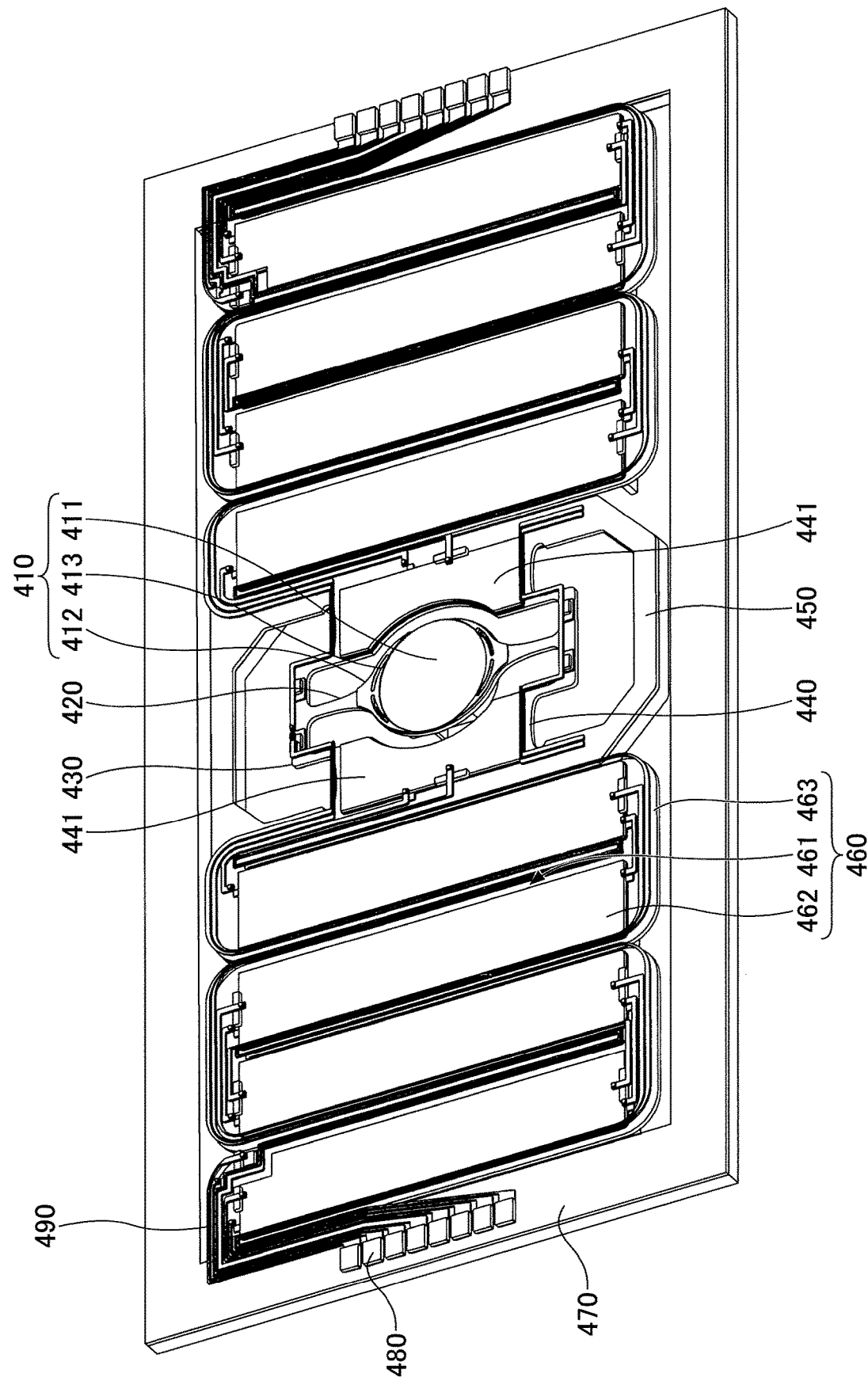
FIG. 11 is a perspective view illustrating the upper surface side of another light scanning apparatus to which the present invention is applied.
Figure 12:
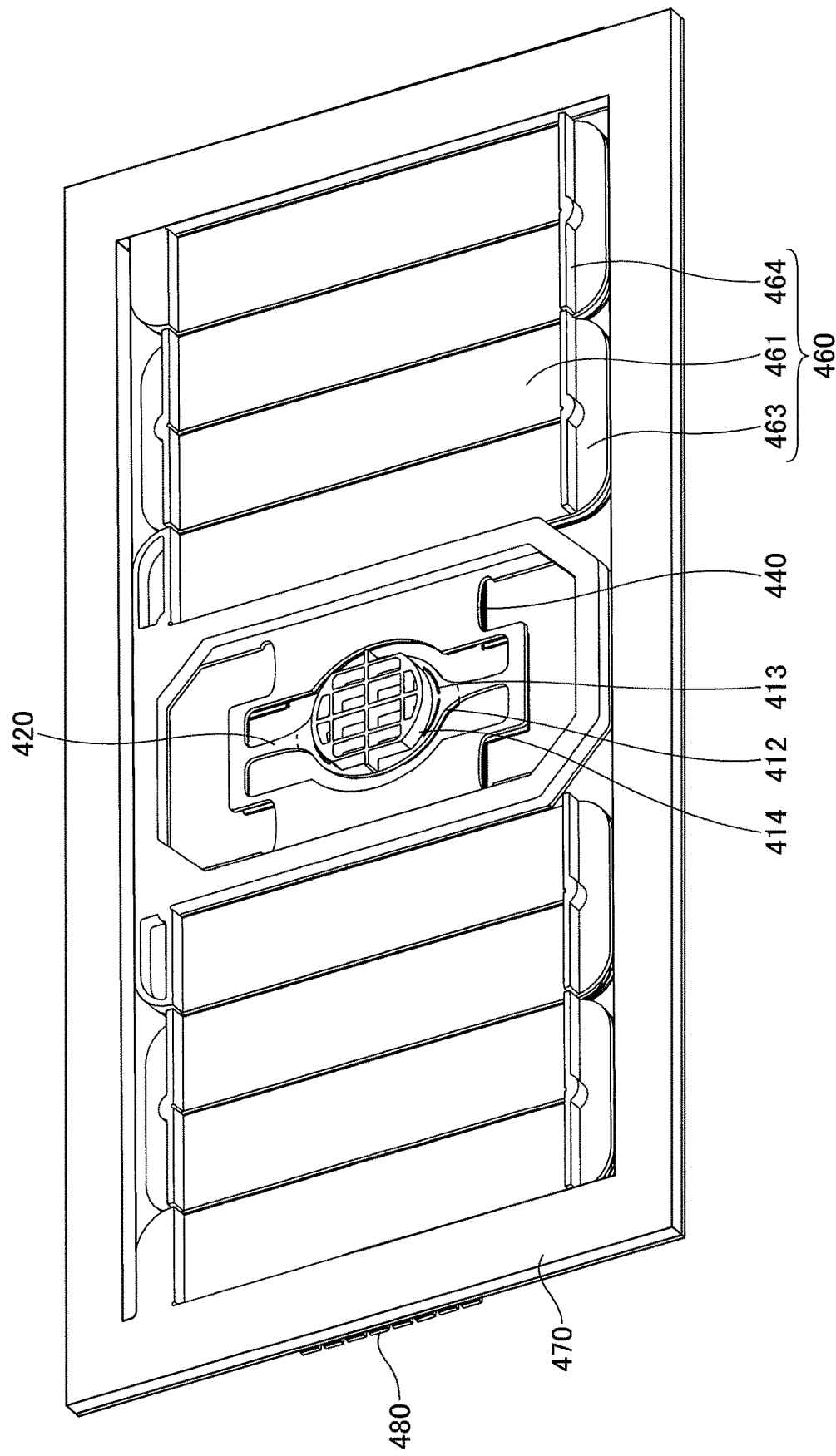
FIG. 12 is a perspective view illustrating the lower surface side of another light scanning apparatus to which the present invention is applied.

FIG. 11 is a perspective view illustrating the upper surface side of another light scanning apparatus 400 to which the present invention is applied. FIG. 12 is a perspective view illustrating the lower surface side of another light scanning apparatus 400 to which the present invention is applied.

As illustrated in FIG. 11, the front surface of a light scanning apparatus 400 includes a mirror supporting portion 410 having a mirror 411, a torsion bar 420, a connecting portion 430, a horizontal drive beam 440, a horizontal drive source 441, a movable frame 450, a vertical drive portion 460, a fixed frame 470, a terminal 480, and a wire 490. The vertical drive portion 460 includes a vertical drive beam 461, a vertical drive source 462 and a connecting portion 463.

The mirror supporting portion 410 is sandwiched between two torsion bars 420 from both sides along the same line. The mirror supporting portion 410 has a mirror 411 at a center and a stress relief region 412 between the mirror 411 and the torsion bar 420. Two slits 413 are formed in each stress relief region 412. The torsion bar 420 is also coupled to the horizontal drive beam 440 via the connecting portion 463. The horizontal drive beam 440 includes a horizontal drive source 441 which is a piezoelectric element on the front surface and is connected externally to movable frame 450.

Movable frame 450 supports and surrounds connecting portion 463, torsion bar 420, and mirror supporting portion 410 via horizontal drive beam 440. The movable frame 450 is coupled to a vertical drive beam 461.

The vertical drive beam 461 includes a vertical drive source 462 which is a piezoelectric element on the surface and is provided on opposite sides of the movable frame 450. A plurality of vertical drive beams 461 are connected by connecting portions 463 at the end portions. The innermost vertical drive beam 461 is coupled to the movable frame 450, and the outermost vertical drive beam 461 is coupled to the fixed frame 470.

A fixed frame 470 supports a vertical drive portion 460. Terminals 480 are provided on the surface of the fixed frame 470 and wires 490 are connected.

Horizontal drive beam 440 and vertical drive beam 461 function as actuators to oscillate mirror supporting portion 410 horizontally and vertically to scan the laser light. The mirror supporting portion 410 is resonantly driven horizontally and non-resonantly driven vertically.

As illustrated in FIG. 12, a rib 414 is provided on the back surface of the mirror supporting portion 410. Similar to the ribs 112 in the first embodiment, the ribs 414 may function as contact portions where the intersections are wider than the straight sections and the needles abut through the dicing tape.

A rib 464 is formed on the back side of the connection portion 463. The ribs 464 reinforce the connections of adjacent vertical drive beams 461 and function to enhance stiffness.

Like the first embodiment, the light scanning apparatus 400 is formed by the SOT substrate. The fixed frame 470, movable frame 450, and ribs 414, 464 are formed by etching the support layer of the SOI substrate.

Figure 13:
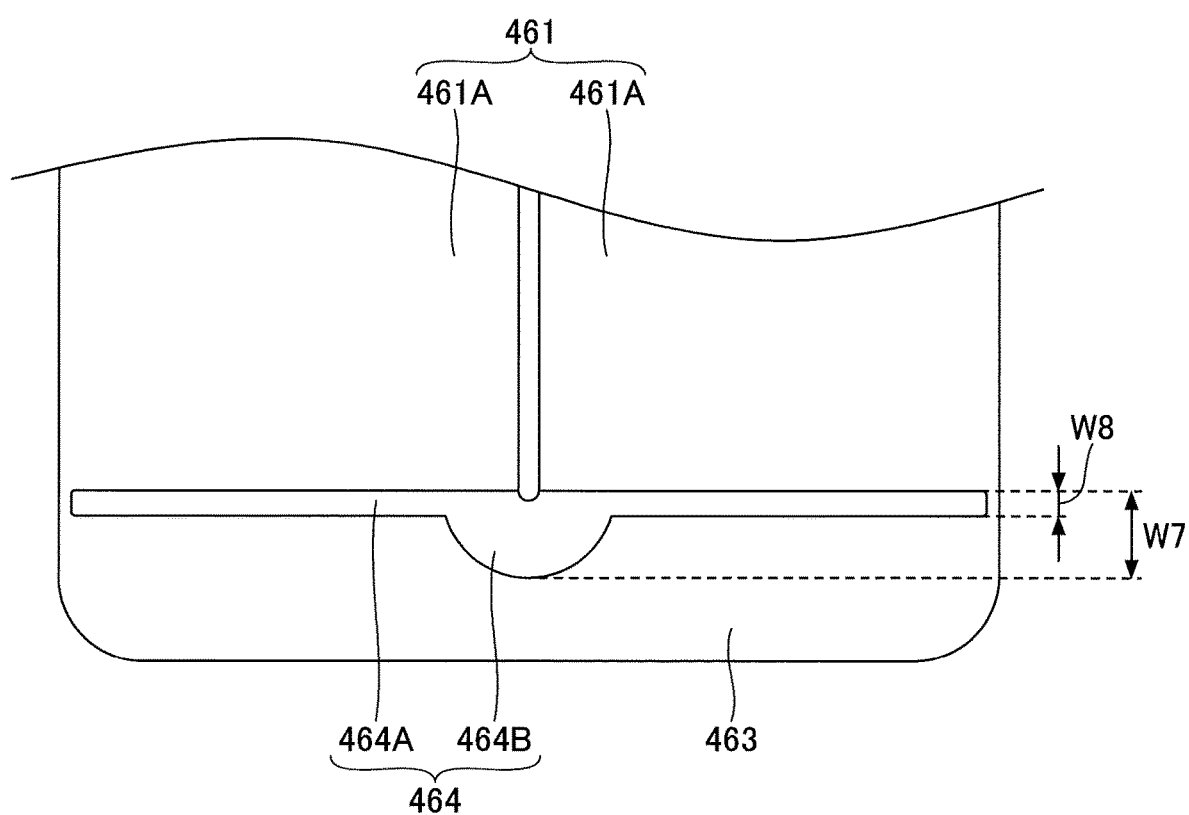
FIG. 13 is an enlarged view illustrating a rear surface of a connection portion.

FIG. 13 is an enlarged view illustrating the back surface side of the connecting portion 463. As illustrated in FIG. 13, each rib 464 has a straight portion 464A that horizontally extends and a semi-circular portion 464B integrally formed in a substantially center of the straight portion 464A. The semi-circular portion 464B is disposed between adjacent vertical beams 461A that form the vertical drive beam 461.

Preferably, the vertical width W7 of the semi-circular portion 464B is larger than the vertical width W8 of the straight portion 464A and is not less than three times (W7≥3W8).

The semi-circular portion 464B functions as the contact portion that contacts the thrust needle through the dicing tape in the pickup process after dicing.

The contact portion (the semi-circular portion 464B) integrally formed with the ribs 464 is positioned so as to be linearly symmetrical with respect to the horizontal rotation axis through the center of the mirror 411. The shape of the contact portion of the ribs 464 may be changed to a circle, rectangle, triangle, or the like.

The light scanning apparatus 400 may be provided with an independent contact portion on the back surface of the vertical drive beam 461 or the like in the same manner as the above-described modifications.

The light scanning apparatus according to the above embodiment can be applied to a two-dimensional scanning light scanning apparatus such as an eyewear or a projector.

According to the present invention, damage in the pickup process can be prevented.

While the preferred embodiments of the invention have been described in detail above, the invention is not limited to the embodiments described above, and various modifications and substitutions can be made to the embodiments described above without departing from the scope of the invention.

EXPLANATION OF NUMERICAL SYMBOLS

100: light scanning apparatus
110: mirror
112: rib
112A: straight
112B: contact portion
112B: intersection portion
120: mirror supporting portion
121A, 121B: coupling portion
130A, 130B: horizontal drive
131A, 131B: horizontal drive source
132: rib
132A: straight
132B1, 132B2: end portion
132B: contact portion
133: horizontal beam
160: movable frame
170A, 170B: vertical drive beam
171A, 171B: vertical drive source
172: rib
172A: straight portion
172B1, 172B2: end portion
172B: contact portion
173: vertical beam
180: dicing tape
220: needle
300, 310, 400, 410, 411, 414: rib

What is claimed is:

1. A light scanning apparatus comprising:
   a mirror supporting portion having a mirror on a front surface thereof;
   an actuator configured to drive the mirror supporting portion and including a pair of adjacent beams;
   a fixed frame disposed around the mirror supporting portion and the actuator;
   a first rib disposed on a back surface side of the actuator, the first rib including a straight portion disposed on a back surface of each of the pair of adjacent beams and an end portion that is wider than the straight portion,
   wherein the end portion of the first rib disposed on the back surface of each of the pair of adjacent beams is adjacent to the end portion of another one of the first rib so as to form the contact portion.

2. The light scanning apparatus according to claim 1, wherein the width of the contact portion is at least three times a width of the straight portion.

3. The light scanning apparatus according to claim 1, wherein the actuator drives the mirror supporting portion around a horizontal rotation axis and a vertical rotation axis passing through a center of the mirror as axes, and
   wherein the contact portion includes a plurality of contact portions and each contact portion of the plurality of contact portions is disposed symmetrically with respect to at least one of the horizontal rotation axis and the vertical axis of rotation.

4. The light scanning apparatus according to claim 3, wherein the pair of adjacent beams is a pair of adjacent horizontal beams.

5. The light scanning apparatus according to claim 4, wherein the contact portion disposed on the back surface of each of the pair of adjacent horizontal beams is positioned on the horizontal rotation axis.

6. The light scanning apparatus according to claim 5, wherein the pair of adjacent horizontal beams is disposed on both sides of the mirror supporting portion, and
   wherein the contact portion disposed on the back surface of each of the pair of adjacent horizontal beams is disposed at a position symmetrical with respect to the vertical rotation axis.

7. The light scanning apparatus according to claim 3, wherein the pair of adjacent beams is a pair of adjacent vertical beams.

8. The light scanning apparatus according to claim 7, wherein the pair of adjacent vertical beams is disposed on both sides of the mirror supporting portion, and
   wherein the contact portion provided on the back surface of each of the pair of adjacent vertical beams is disposed at a position that is linearly symmetrical with respect to the horizontal rotation axis.

9. The light scanning apparatus according to claim 1, wherein each end portion of each of a pair of adjacent vertical beams is connected to a turn-back portion of the actuator, wherein each rib provided on the back surface of each of the pair of adjacent vertical beams is disposed in the turn-back portion and includes
the straight portion which extends in a horizontal direction, and
the contact portion which is integrally formed substantially in a center of the straight portion and is provided in the turn-back portion, and
wherein the contact portion provided in the turn-back portion is disposed between the pair of adjacent vertical beams forming a vertical drive beam.

10. The light scanning apparatus according to claim 7, wherein a vertical drive source is provided on the front surface of each of the pair of adjacent vertical beams, and
wherein the vertical drive source has a notch formed in a portion facing the end portion of the rib disposed on the back surface of each of the pair of adjacent vertical beams.

11. The light scanning apparatus according to claim 1, the light scanning apparatus further comprising:
a second rib disposed on a back surface side of the mirror supporting portion, the second rib including a straight portion and a contact portion having a width wider than a width of the straight portion.

* * * * *